(12) United States Patent
Tsai et al.

(10) Patent No.: US 9,953,896 B2
(45) Date of Patent: Apr. 24, 2018

(54) HEAT DISSIPATING MODULE, HEAT DISSIPATING SYSTEM AND CIRCUIT MODULE

(71) Applicant: COOLER MASTER TECHNOLOGY INC., New Taipei (TW)

(72) Inventors: Chang-han Tsai, New Taipei (TW); Shui-Fa Tsai, New Taipei (TW)

(73) Assignee: COOLER MASTER TECHNOLOGY INC., New Taipei (TW)

( * ) Notice: Subject to any disclaimer, the term of this patent is extended or adjusted under 35 U.S.C. 154(b) by 30 days.

(21) Appl. No.: 15/093,175

(22) Filed: Apr. 7, 2016

(65) Prior Publication Data

US 2017/0105312 A1    Apr. 13, 2017

(30) Foreign Application Priority Data

Oct. 12, 2015   (CN) ..................... 2015 2 0788842 U

(51) Int. Cl.
*H05K 7/20*   (2006.01)
*G06F 1/20*   (2006.01)
*H01L 23/473*   (2006.01)

(52) U.S. Cl.
CPC .............. *H01L 23/473* (2013.01); *G06F 1/20* (2013.01); *H05K 7/20218* (2013.01); *H05K 7/20263* (2013.01); *H05K 7/20272* (2013.01); *H05K 7/20409* (2013.01)

(58) Field of Classification Search
CPC ............. H04N 5/23212; H04N 5/2353; H04N 5/2254; G02B 7/365; G02B 7/34; H05K 7/2039; H05K 7/20827; F28D 15/0266; F28D 15/0275; F24J 3/086; Y02E 10/10
See application file for complete search history.

(56) References Cited

U.S. PATENT DOCUMENTS

| | | | | |
|---|---|---|---|---|
| 5,731,954 | A * | 3/1998 | Cheon | F25B 21/02 165/104.33 |
| 5,901,037 | A * | 5/1999 | Hamilton | F28F 3/12 165/80.4 |
| 6,019,165 | A * | 2/2000 | Batchelder | F25B 21/02 165/104.33 |
| 6,796,370 | B1 * | 9/2004 | Doll | F28F 3/048 165/168 |
| 7,325,591 | B2 * | 2/2008 | Duan | H01L 23/473 165/104.33 |

(Continued)

FOREIGN PATENT DOCUMENTS

TW         M324810         1/2008

*Primary Examiner* — Robert J Hoffberg
*Assistant Examiner* — Matt Dhillon
(74) *Attorney, Agent, or Firm* — Winston Hsu

(57) ABSTRACT

The present application provides a heat dissipating module, a heat dissipating system and a circuit module. The heat dissipating module adapted to be used with a heat element. The heat dissipating module comprises a heat exchanger which has a heat exchanging zone contacted with the heat element; a securing structure; and a fluid driving unit which is communicated with the heat exchanger for guiding a working fluid into the heat exchanger and is secured to the heat exchanger by the securing structure, wherein the fluid driving unit and the second heat exchanger are separately installed and communicated with each other.

10 Claims, 12 Drawing Sheets

(56) References Cited

U.S. PATENT DOCUMENTS

| | | | | |
|---|---|---|---|---|
| 7,359,197 B2* | 4/2008 | Stefanoski | ............... | G06F 1/20 |
| | | | | 165/104.33 |
| 7,455,103 B2* | 11/2008 | Sato | ................... | H05K 7/20281 |
| | | | | 165/104.31 |
| 7,543,457 B2* | 6/2009 | Crocker | ............... | F04D 29/588 |
| | | | | 165/104.33 |
| 7,591,302 B1* | 9/2009 | Lenehan | ................ | H01L 23/34 |
| | | | | 165/104.33 |
| 7,971,632 B2* | 7/2011 | Eriksen | .................... | G06F 1/20 |
| | | | | 165/104.31 |
| 8,245,764 B2* | 8/2012 | Eriksen | ................ | H01L 23/473 |
| | | | | 165/80.4 |
| 2002/0117291 A1* | 8/2002 | Cheon | ....................... | G06F 1/20 |
| | | | | 165/80.4 |
| 2004/0052663 A1* | 3/2004 | Laing | ................... | F04D 29/588 |
| | | | | 417/423.8 |
| 2004/0105232 A1* | 6/2004 | Ito | ........................... | F04D 5/002 |
| | | | | 361/679.53 |
| 2005/0061482 A1* | 3/2005 | Lee | .......................... | F28F 3/02 |
| | | | | 165/96 |
| 2005/0083656 A1* | 4/2005 | Hamman | ............... | F28D 15/00 |
| | | | | 361/699 |
| 2006/0169440 A1* | 8/2006 | Chou | ................... | F28D 1/0477 |
| | | | | 165/104.33 |

* cited by examiner

HEAT DISSIPATING MODULE, HEAT DISSIPATING SYSTEM AND CIRCUIT MODULE

FIELD OF THE INVENTION

The present invention relates to a heat dissipating module, a heat dissipating system and a circuit module. Particularly, the present invention relates to a heat dissipating module and heat dissipating system applied on an integrated circuit chip, and a circuit module comprising the heat dissipating module and the heat dissipating system.

BACKGROUND OF THE INVENTION

Please refer to FIG. 1, which is a sectional diagram of a liquid-cooling system in prior art. Details of FIG. 1 could be obtained by referring to U.S. Pat. No. 8,240,362 and U.S. Pat. No. 8,245,764. A surface of the IC chip 1 is contacted with a surface of the heat sink 10 so that the thermal energy generated by the IC chip 1 can be conducted to the liquid tank 11 via the heat sink 10. An impeller 12 driven by electric motor (not shown) is integrated in the liquid tank 11 for exhausting the high-temperature liquid in the liquid tank from the exit 16 and sending back the low-temperature liquid, which is cooled down by heat exchange in a heat radiator (not shown), to the liquid tank 11 via the inlet 15. However, in the cooling system mentioned above, the high-temperature liquid and the low-temperature liquid might be usually mixed in the liquid tank 11 so that an efficiency of heat dissipating is reduced and the requirement of heat dissipating for those IC chips with increasingly working temperature cannot be met.

SUMMARY OF THE INVENTION

Therefore, one subject of the present invention is to improve the technology of a fluid cooling system for the IC chips.

In one aspect, the present invention provides a heat dissipating module adapted to be contacted with a heat element. The heat dissipating module comprises a heat exchanger which has a heat exchanging zone contacted with the heat element; a securing structure; and a fluid driving unit which is communicated with the heat exchanger for guiding a working fluid into the heat exchanger and is secured to the heat exchanger by the securing structure, wherein the fluid driving unit and the second heat exchanger are separately installed and communicated with each other.

In another aspect, the present invention provides a heat dissipating system adapted to be used with a heat element. The heat dissipating system comprises a plurality of communicating pipelines for transmitting a working fluid; a first heat exchanger; a second heat exchanger which is communicated with the first heat exchanger via a selected one of the communicating pipelines and has a heat exchanging zone adapted to contact with the heat element; a securing structure; and a fluid driving unit which is secured to the second heat exchanger by the securing structure, wherein the fluid driving unit and the second heat exchanger are separately installed and communicated with each other, and the fluid driving unit is communicated with the first heat exchanger via another selected one of the communicating pipelines.

In further another aspect, the present invention provides a circuit module comprising: a heat element; a first heat exchanger; a second heat exchanger which is communicated with the first heat exchanger via a communicating pipeline, and has a heat exchanging zone for contacting with the heat element; a securing structure; and a fluid driving unit which is secured to the second heat exchanger by the securing structure, wherein the fluid driving unit and the second heat exchanger are separately installed and communicated with each other, and the fluid driving unit is communicated with the first heat exchanger via another communicating pipeline.

According to the technique solutions above, the second heat exchanger in one embodiment of the present invention comprises: a substrate having the heat exchanging zone; a plurality of fins being disposed on the substrate; and a first casing covering the substrate and the fins and forming a cavity, wherein the first casing has a fluid access, and the cavity is communicated with the fluid driving unit via the fluid access.

According to the technique solutions above, the fluid driving unit in one embodiment of the present invention comprises: an impeller unit providing power to transmit the working fluid into the second heat exchanger; and a stator unit disposed between the impeller unit and the second heat exchanger for driving the impeller unit.

According to the technique solutions above, one embodiment of the present invention provides a luminous element which is disposed on the stator unit and illuminates in accordance with a preset procedure.

According to the technique solutions above, one embodiment of the present invention provides a fluid level detector or a flow meter for detecting an amount of the working fluid or a flow rate of the working fluid, wherein the luminous element makes a warning or a power consumption of the heat element is reduced when the amount of the working fluid is not enough or the flow rate of the working fluid is abnormal.

According to the technique solutions above, the securing structure in one embodiment of the present invention comprises at least one fixed column and at least one limiting wall, and the fixed column is disposed between the fluid driving unit and the second heat exchanger for reserving a gap between the fluid driving unit and the second heat exchanger.

According to the technique solutions above, in one embodiment of the present invention, the circuit module is a display card and the heat element is a graphic processing unit.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
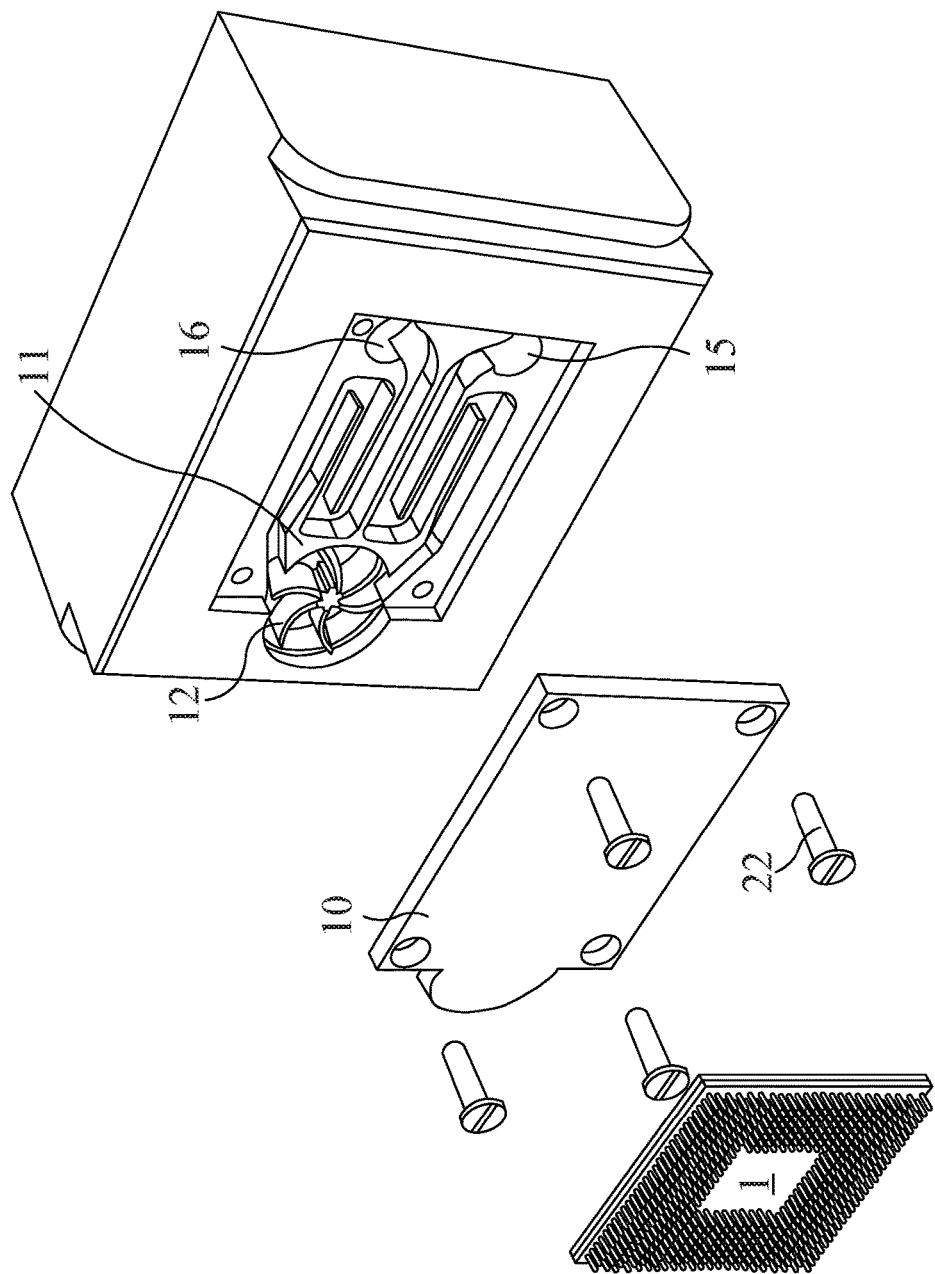
FIG. 1 is a sectional schematic diagram of a liquid-cooling system in prior art.
Figure 2A:
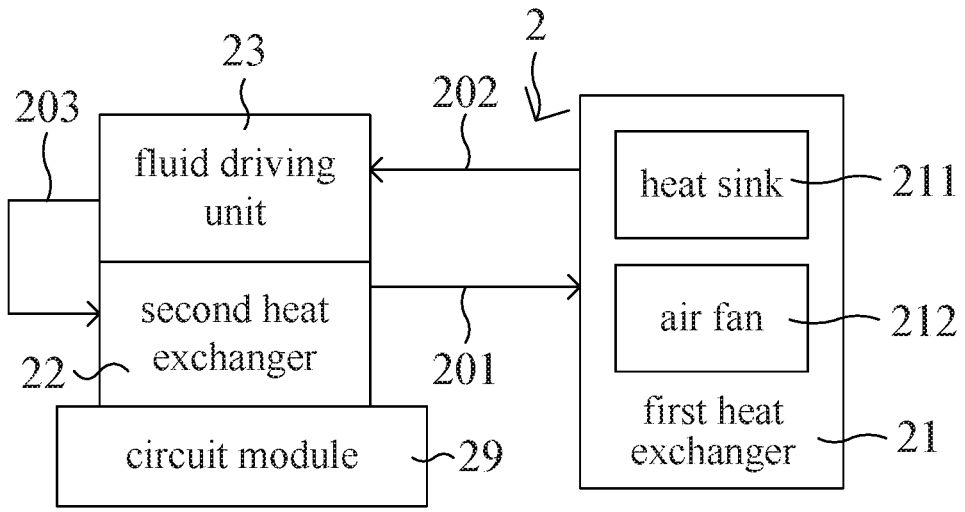
FIG. 2a is a functional block diagram of the heat dissipating system according to a first embodiment of the present invention.

Please refer to FIG. 2a, which is a functional block diagram of the heat dissipating system according to a first embodiment of the present invention. The heat dissipating system 2 can be adapted to heat dissipation of a circuit module 29, such like a mother board, a graphic card . . . etc., and the heat dissipating system 2 comprises a plurality of communicating pipelines, such as a first communicating pipeline 201, a second communicating pipeline 202 and a third communicating pipeline 203 for transmitting a working fluid. The first heat exchanger 21 is communicated with the first communicating pipeline 201 and the second communicating pipeline 202, receives the working fluid via the first communicating pipeline 201 for dissipating heat to environment, such as air, and then outputs the cooled working fluid to the communicating pipeline 202. The first heat exchanger 21 in the present invention could be combination of an ordinary heat sink 211, such like a radiator, and an ordinary fan 212, wherein the heat sink 211 is communicated with the first communicating pipeline 201 and the second communicating pipeline 202 for receiving the working fluid via the first communicating pipeline 201 to dissipate heat to environment, such as air, and then outputs the cooled working fluid to the communicating pipeline 202; and the fan 212 forces the air in the environment to flow in order to dissipate heat.

The heat dissipating module in the heat dissipating system of this embodiment further comprises a second heat exchanger 22 and a fluid driving unit 23. The second heat exchanger 22 has a casing, is communicated with the first communicating pipeline 201 and the third communicating pipeline 203, and is contacted with a surface of the circuit module 29 or an area near the surface of the circuit module 29, wherein the second heat exchanger 22 conducts the thermal energy from the circuit module 29 to the working fluid flowing through the second heat exchanger 22. The fluid driving unit 23 forms another single casing and is stacked with the second heat exchanger to form a stack structure. The fluid driving unit 23 is communicated with the second communicating pipeline 202 and the third communicating pipeline 203 for providing power to transmit the working fluid therein to the second heat exchanger 22 via the third communicating pipeline 203 and to transmit the working fluid in the second heat exchanger 22 to the first heat exchanger 21 through the first communicating pipeline 201.

Figure 2B:
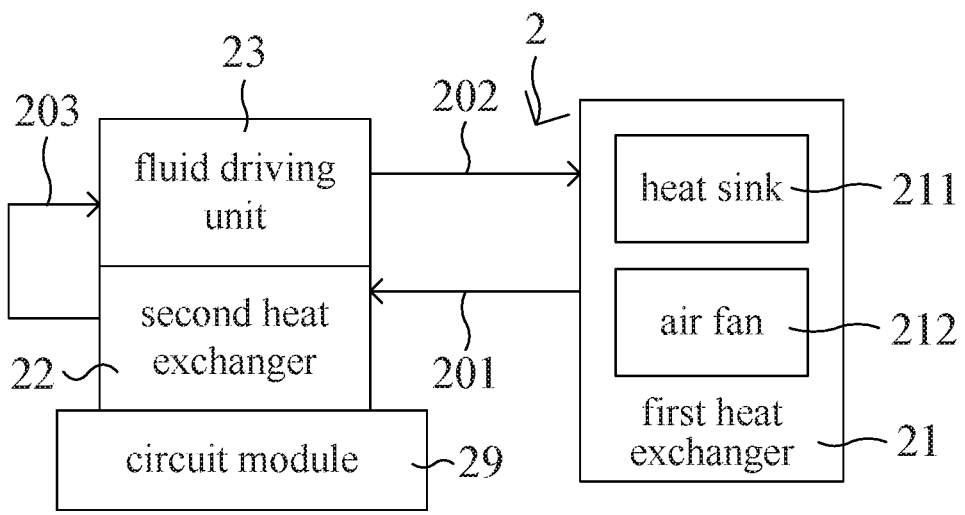
FIG. 2b is a functional block diagram of the heat dissipating system according to a second embodiment of the present invention.

Please refer to FIG. 2b, which is a functional block diagram of the heat dissipating system according to a second embodiment of the present invention. Most elements shown in FIG. 2b is the same as those shown in FIG. 2a. A difference between FIG. 2b and FIG. 2a is the flow direction of the working fluid transmitted by the fluid driving unit 23 of the heat dissipating system 2. In the embodiment, the fluid driving unit 23 is communicated with the second communicating pipeline 202 and the third communicating pipeline 203 for providing power to transmit the working fluid from the first heat exchanger 21 to the second heat exchanger 22 via the first communicating pipeline 201 and transmit the working fluid from the fluid driving unit 23 to the first heat exchanger 21 via the second communicating pipeline.

The circuit module 29 could be IC chips or any other circuit modules which have to be cooled. The first communicating pipeline 201, the second communicating pipeline 202 and the third communicating pipeline 203 could be made of flexible pipes or metal pipes, and the working fluid transmitted therein could be pure water or liquid in which water exists.

Figure 3:
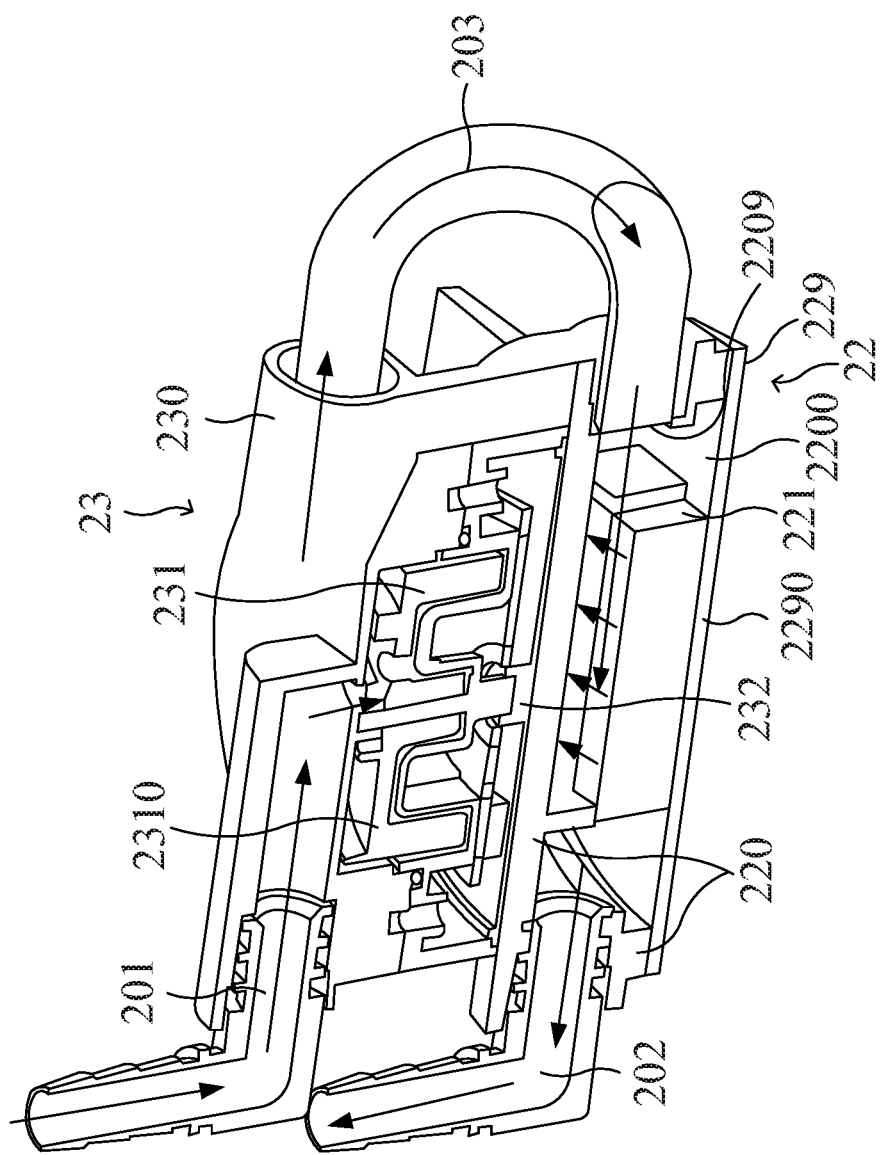
FIG. 3 is a sectional structure diagram of the fluid driving unit and the second heat exchanger according to a first embodiment of the present invention.

Please also refer to FIG. 3, which is a sectional structure diagram of the fluid driving unit 23 and the second heat exchanger 22 according to a first embodiment of the present invention. Wherein, the fluid driving unit 23 mainly comprises a casing 230 which is made independently, and the space enclosed by the casing 230 is communicated with the first communicating pipeline 201 and the third communicating pipeline 203. The impeller unit 231 is used for pumping the working fluid from the first heat exchanger 21, transmitting the working fluid to the casing 230 of the fluid driving unit 23 via the first communicating pipeline 201, and then transmitting the working fluid to the second heat exchanger 22 via the third communicating pipeline 203. The second heat exchanger comprises a substrate 229 and a fin structure 221, wherein a heat exchanging zone 2290 and the fin structure 221 being composed of a plurality of fins are on the substrate 229. The heat exchanging zone 2290 contacts and exchanges thermal energy with a heat element, such as the circuit module 29 shown in FIG. 2a and FIG. 2b. The casing 220 covers the substrate 229 and the fin structure 221 and forms a cavity 2200, wherein the shell 220 comprises a fluid access 2209, and the cavity 2200 is communicated with the fluid driving unit 23 via the fluid access 2209 and the third communicating pipeline 203. The fin structure 221 in the cavity 2200 comprises a plurality of fins and is sunk in the working fluid so that a great amount of areas could be sunk in the working fluid for effectively performing heat exchange between the fin structure 221 and the working fluid. The thermal energy generated by the circuit module 29 is conducted to the working fluid through the heat exchanging zone 2290 and the fin structure 221, and the working fluid is transmitted to the first heat exchanger 21 via the second communicating pipeline 202. The stator unit 232 is disposed between the casing 220 and the casing 230, and is electrically coupled to the impeller unit 231 to provide electrical power to drive the impeller unit 231. In other words, the stator unit 232 is disposed between the impeller unit 231 and the second heat exchanger 22. The impeller unit 231 in this figure primarily comprises an impeller 2310 for driving the working fluid to enter the casing 230 via the first communicating pipeline 201 and driving the working fluid to leave the casing 230 via the third communicating pipeline 203.

Figure 4A:
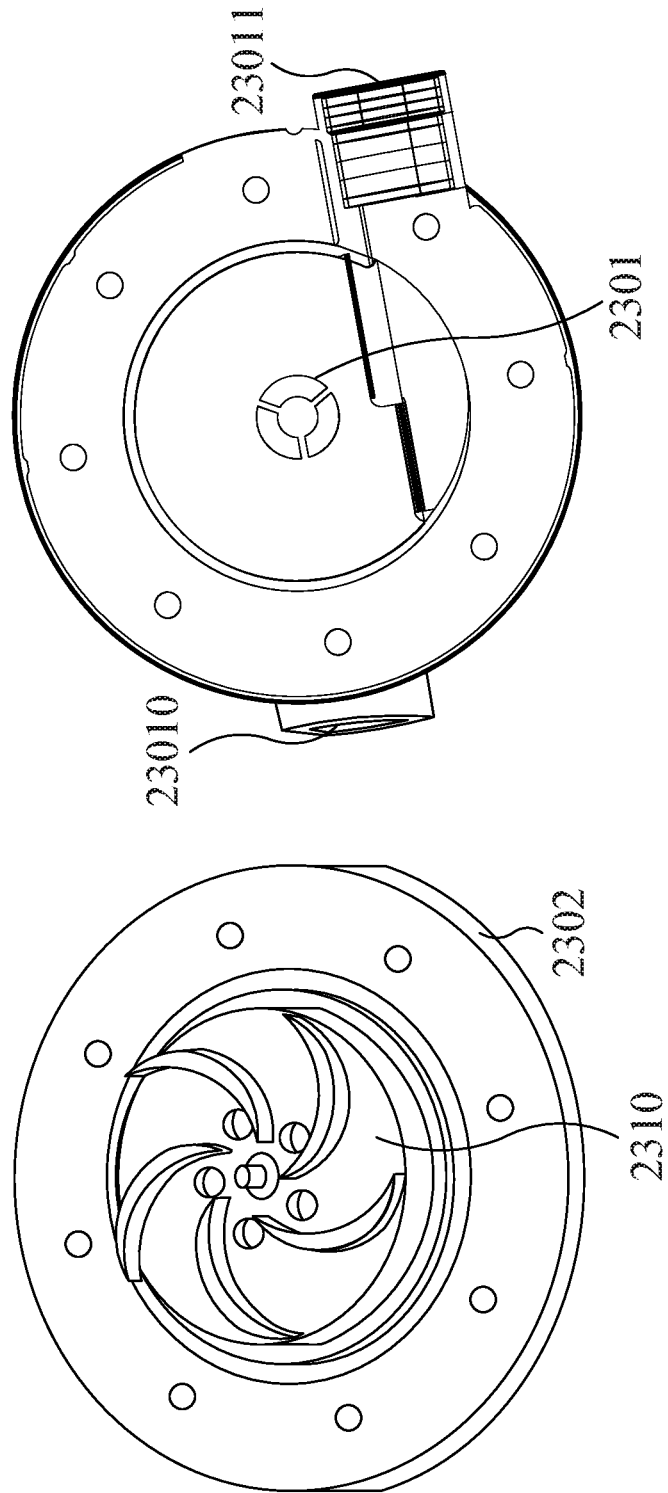
FIGS. 4a~4c are schematic diagrams of outer and inner structures of the fluid driving unit according to one embodiment of the present invention.
Figure 4B:
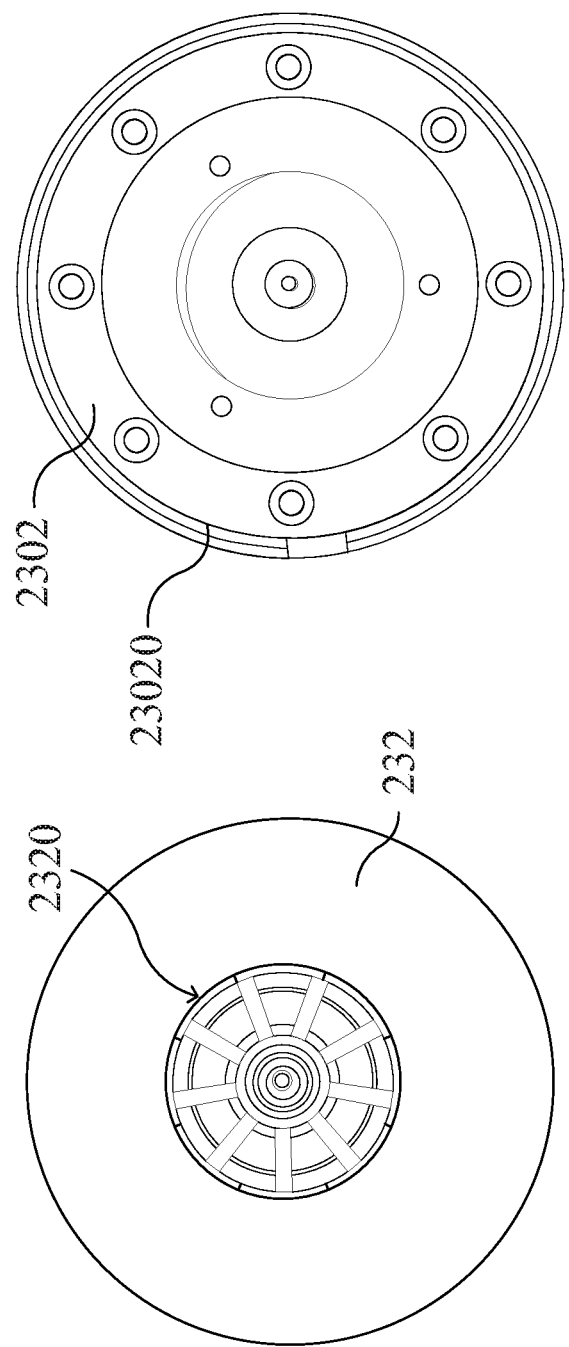
Figure 4C:
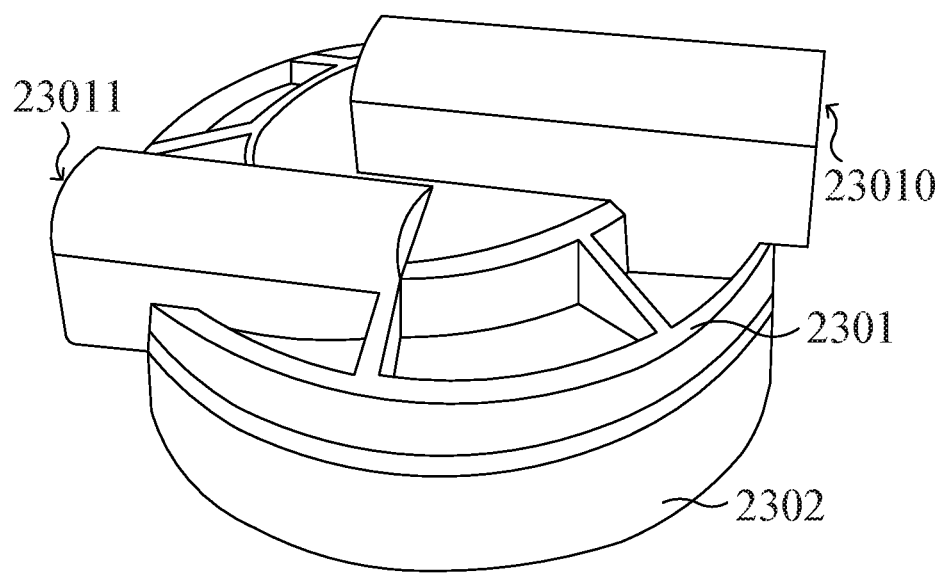

Please also refer to FIGS. 4a~4c, which are schematic diagrams of outer and inner structures of the fluid driving unit 23 according to one embodiment of the present invention. The casing 230 of the fluid driving unit 23 comprises an upper part 2301 and a lower part 2302, wherein the upper part 2301 comprises a fluid inlet 23010 for communicating with the first communicating pipeline 201 and a fluid exit 23011 for communicating with the third communicating pipeline 203. The impeller 2310 is disposed at the lower part 2302, and the space for disposing the impeller 2310 and transmitting the working fluid could be formed by engaging the inner portion of the upper part 2301 and the inner portion of the lower part 2302. The stator unit 232 is disposed at the bottom portion 23020 of the lower part 2302, and a stator 2320, which is necessary for an electric motor, is disposed on the stator unit 232 to provide power required for rotating the impeller 2310.

Figure 5A:
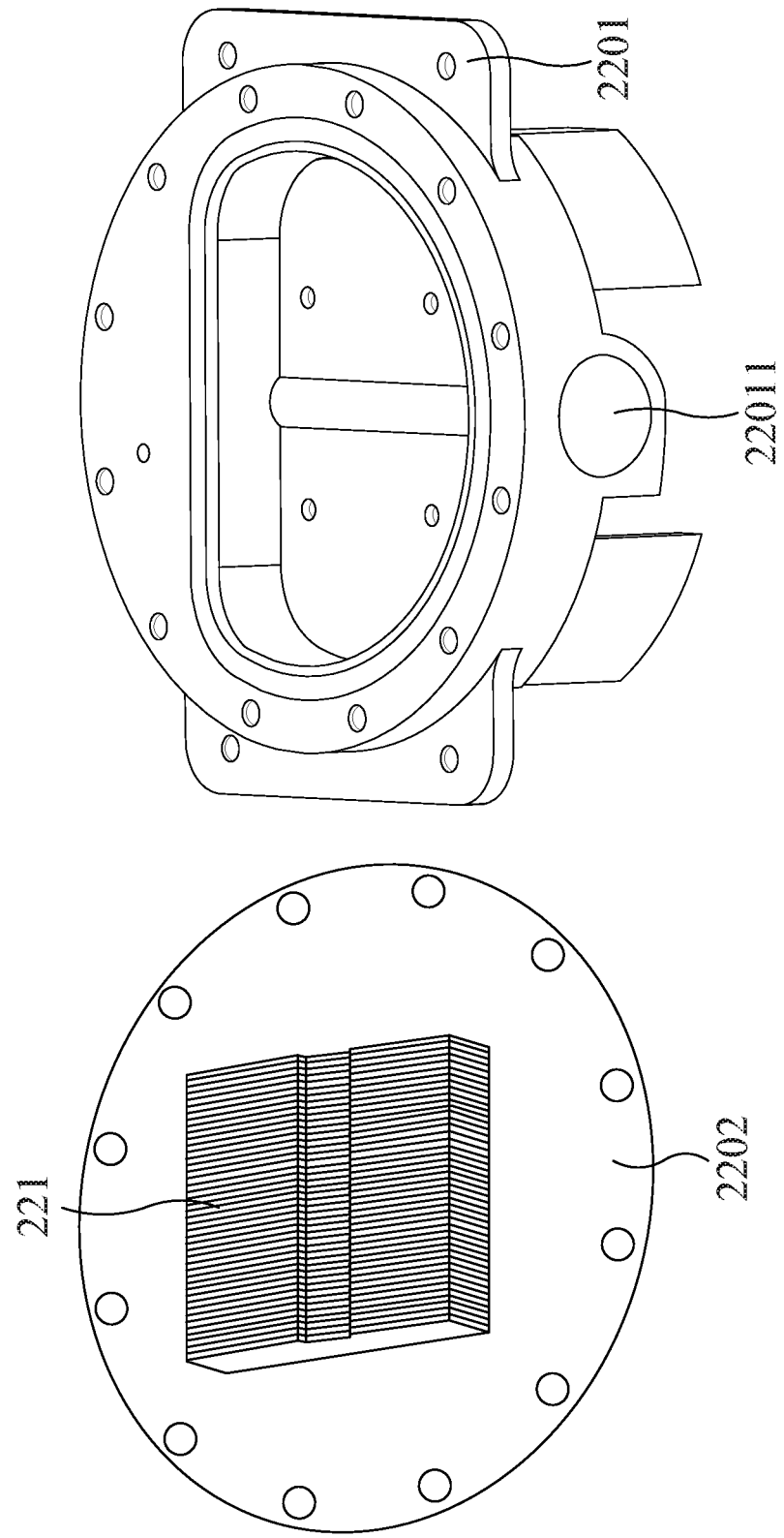
FIGS. 5a~5b are schematic diagrams of outer and inner structures of the second heat exchanger according to one embodiment of the present invention.
Figure 5B:
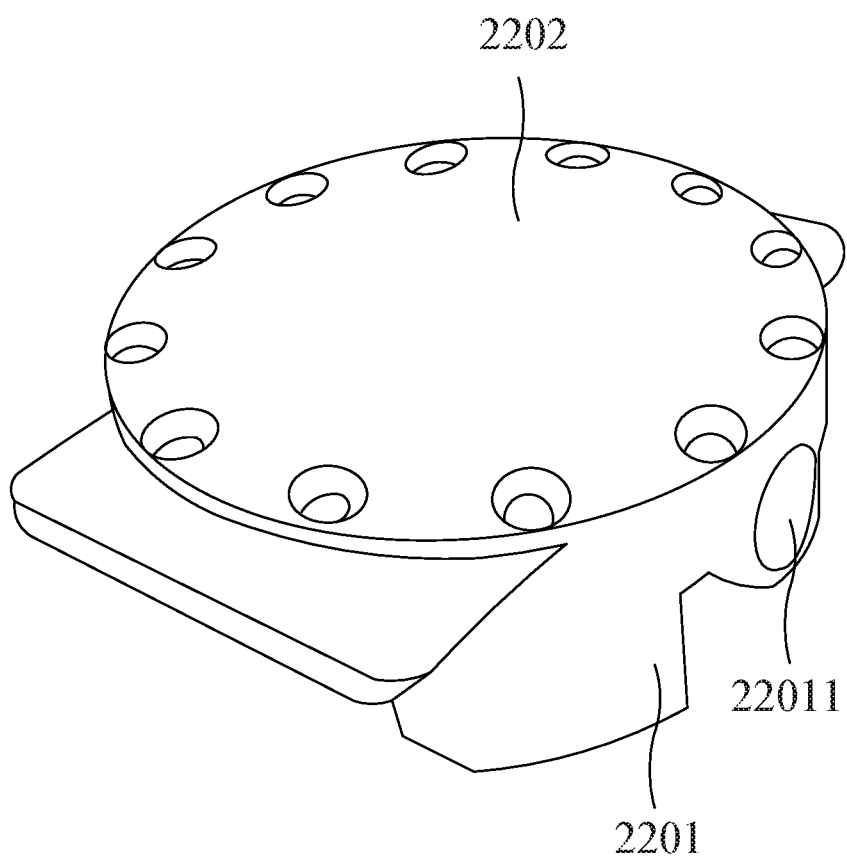

Please also refer to FIGS. 5a~5b, which are schematic diagrams of outer and inner structures of the second heat exchanger 22 according to one embodiment of the present invention. Similarly, the casing 220 of the second heat exchanger 22 primarily comprises an upper part 2201 and a lower part 2202, wherein the upper part 201 comprises a fluid inlet 22010 for communicating with the third communicating pipeline 203 and a fluid exit 22011 for communicating with the second communicating pipeline 202. The fin structure 21 comprising a plurality of fins could be made of one metal material or several different materials in case the materials being with good thermal conductivity. The space for disposing the fin structure 221 and transmitting the working fluid could be formed by engaging the inner portion of the upper part 2201 and the lower part 2202. The fin structure 221 provides a great amount of areas to be sunk in the working fluid by making the fins in small depth, so that the thermal energy generated by the circuit module 29 could be conducted to the working fluid, and the working fluid is then transmitted to the first heat exchanger 21 via the second communicating pipeline 202.

Figure 6:
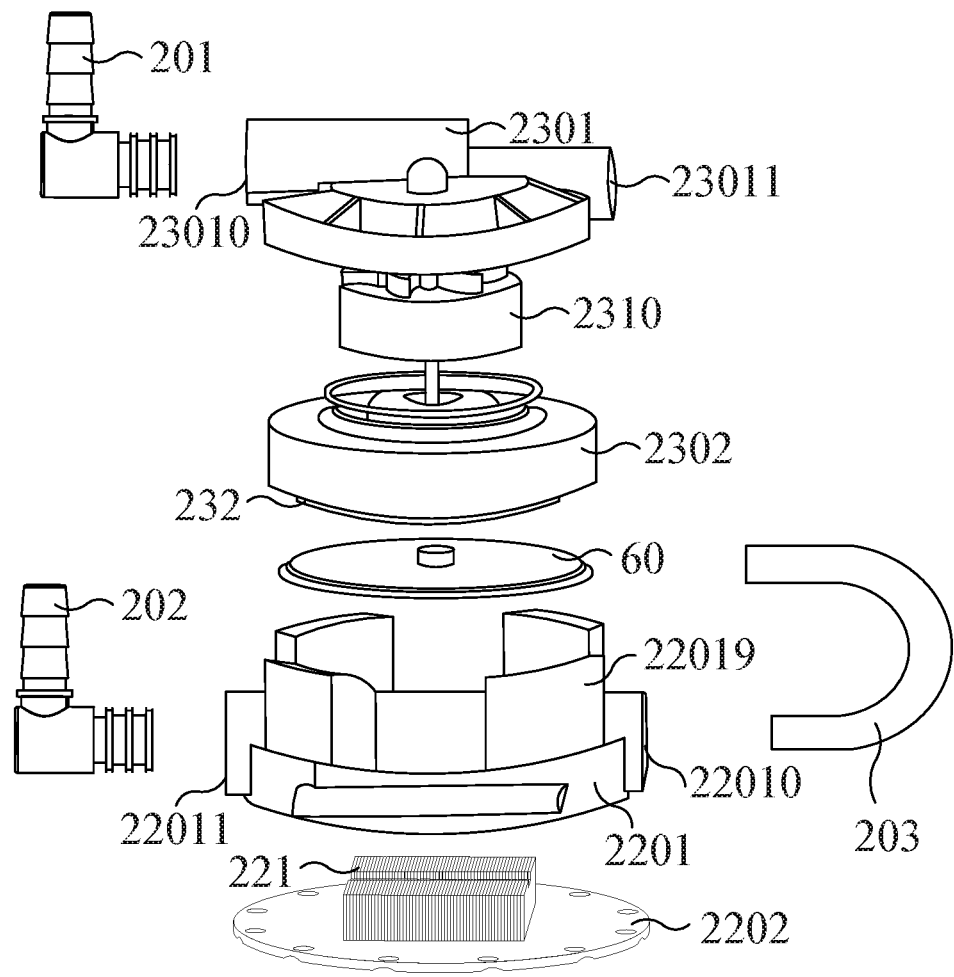
FIG. 6 is an exploded diagram of the fluid driving unit and the second heat exchanger according to the first embodiment shown in FIG. 3.

Please also refer to FIG. 6, which is an exploded diagram of the fluid driving unit 23 and the second heat exchanger 22 according to the first embodiment shown in FIG. 3, wherein the shape of each element is shown in detail. The chassis 60 covers the stator unit 232 to dispose the stator unit 232 at the bottom portion 23020 of the lower part 2302 of the casing 230. The upper part 2201 of the casing 220 comprises a securing structure made of a plurality of fixed plates 22019 so that an accommodation area could be formed and the fluid driving unit 23 could be clamped by the fixed plates 22019 due to the restoring forces thereof. Furthermore, when a luminous element (not shown), such as a light emitting diode, is disposed on the stator unit 232, the bottom portion 23020 of the lower part 2302 of the casing 232 or the chassis 60 could be made of transparent or translucent materials or a light guiding apparatus (not shown) could be formed on the stator unit 232, so that light emitted from the luminous element can be observed by others. The luminous element illuminates in accordance with a preset procedure, or, the luminous element illuminates in response to characteristic of the flow of the working fluid. Moreover, a fluid level detector or a flow meter could be disposed in the casing or pipelines for detecting whether an amount of the working fluid is enough or detecting whether a flow rate of the working fluid is normal. When the amount of the working fluid is not enough or the flow rate of the working fluid is abnormal, the luminous element on the stator unit 232 could be used to make a warning, or the detected result could be transmitted by a signal path to a system (such as a computer) correlated with the circuit module 29 to allow the circuit module and the correlated system (such as a computer) perform a corresponded operation, for example: reducing the frequency of an operating clock, to reduce power consumption of the heat element.

Figure 7A:
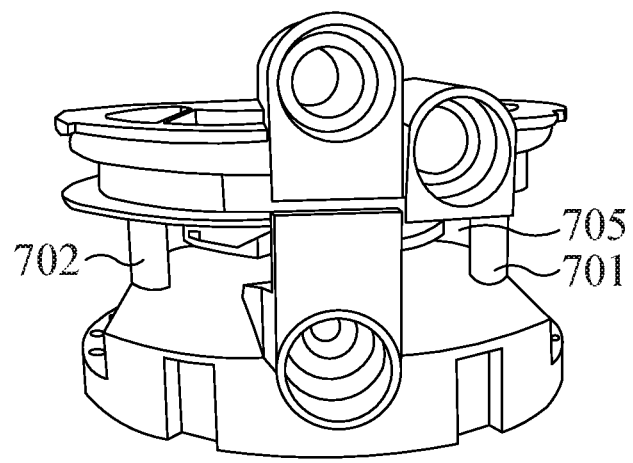
FIGS. 7a~7b are schematic structure diagrams of the fluid driving unit and the second heat exchanger according to a second embodiment of the present invention.
Figure 7B:
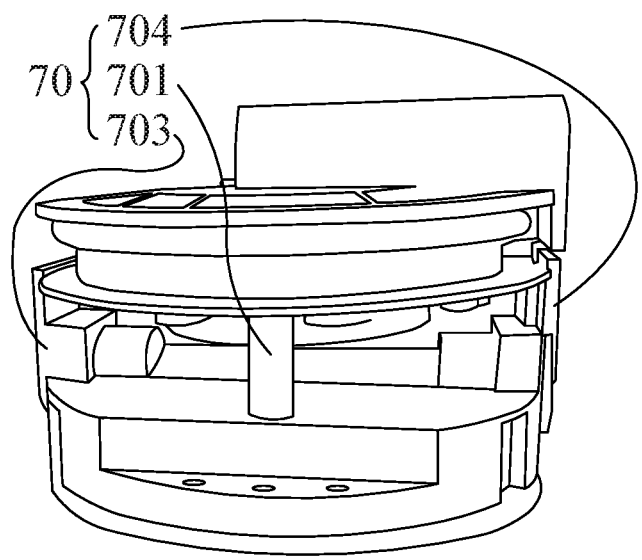

Please refer to FIGS. 7a~7b, which are schematic structure diagrams of the fluid driving unit 23 and the second heat exchanger 22 according to a second embodiment of the present invention. The fluid driving unit 23 is stacked above the second heat exchanger 22 and is secured to the second heat exchanger 22 by a securing structure 70 comprising at least one or a plurality of fixed columns 701 and 702, and at least one or a plurality of limiting walls 703 and 704. It can be observed that a gap 705 is reserved between the fluid driving unit 23 and the second heat exchanger 22 by using the fixed columns 701 and 702. Accordingly, the embodiment improves thermal-isolating effect between the fluid driving unit 23 and the second heat exchanger 22, and improves the heat dissipating effect of the fluid driving unit 23 and the second heat exchanger 22.

Figure 8:
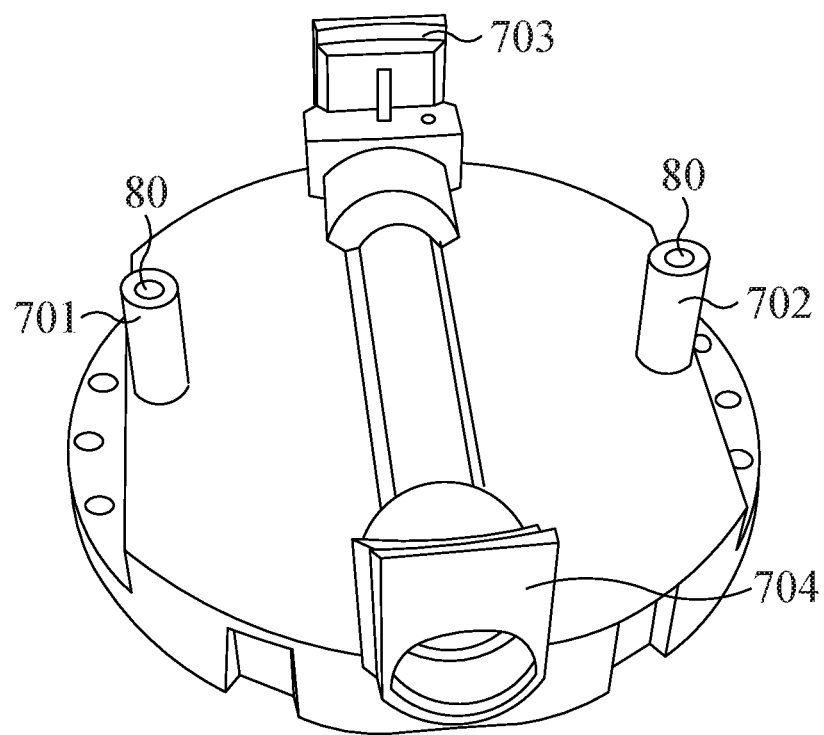
FIG. 8 is a schematic diagram showing appearance of the fixed columns and the limiting walls on the surface of the second heat exchanger according to the second embodiment shown in FIGS. 7a~7b.

Please refer to FIG. 8, which is a schematic diagram clearly showing the appearance of the fixed columns 701 and 702 and the limiting walls 703 and 704 on the surface of the second heat exchanger 22. Each of the fixed columns 701 and 702 comprises a hollow screw locking space 80, and the limiting walls 703 and 704 are used for clamping the fluid driving unit (not shown in this figure) to limit the horizontal shifting of the fluid driving unit.

Figure 9A:
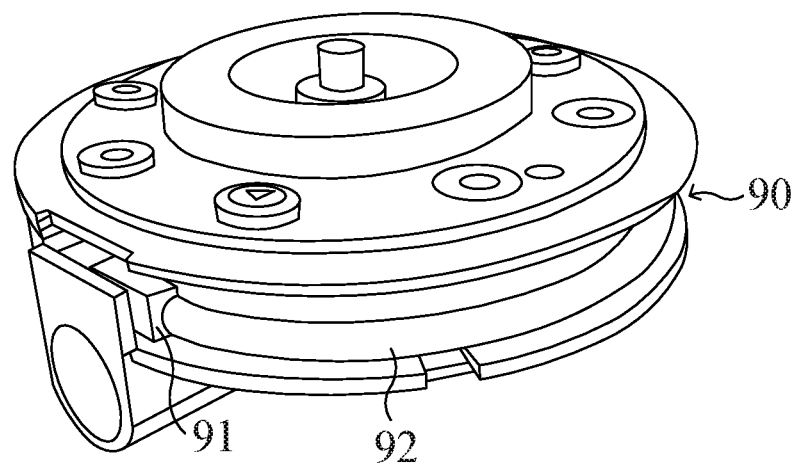
FIGS. 9a~9b are schematic diagrams showing appearance of the fluid driving unit according to the second embodiment shown in FIGS. 7a~7b.
Figure 9B:
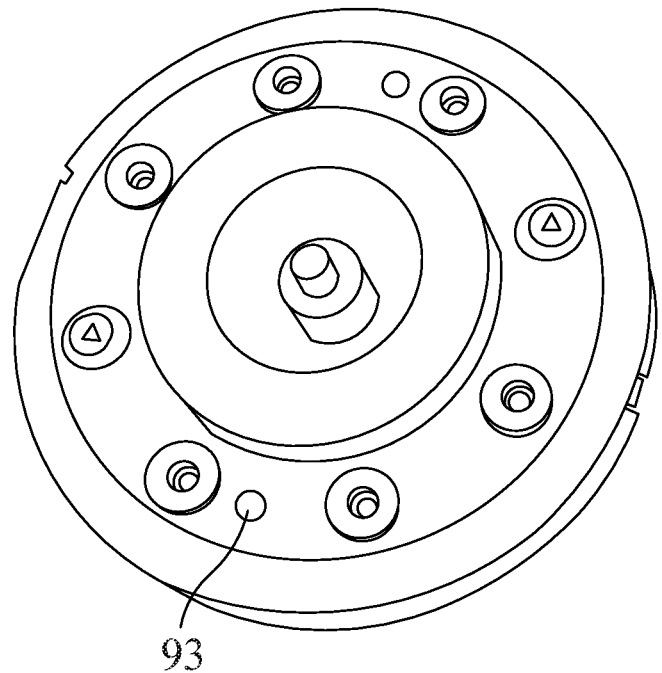

Refer to FIGS. 9a~9b, the appearance of the fluid driving unit according to the second embodiment is shown therein. A circular slot 90 is set at the side of the fluid driving unit, and a luminous element 91 and a light guiding bar 92 are disposed in the circular slot 90. The luminous element 91 could be made of LED (light emitting diodes), and the light guiding bar 92 is used for guiding light to surround the circular slot 90. The tapped hole 93 corresponds to the position of the fixed column 701 and 702 of the securing structure 70 shown in FIGS. 7a and 7b, and a screw (not shown in this figure) could go through the tapped hole 93 to the fixed column 701 and 702 in order to fix the fixed column 701 and 702.

In summary, the present invention solves the problem of poor heat-dissipating effect, can be widely applied to those IC or electronic devices requiring heat dissipation, and maintains excellent design flexibility. While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat dissipating module, which is adapted to be contacted with a heat element, comprising:
   a heat exchanger, which has a heat exchanging zone contacted with the heat element, the heat exchanger further comprising a first casing, a cavity being formed inside the first casing of the heat exchanger;
   a securing structure; and
   a fluid driving unit, which is communicated with the heat exchanger for guiding a working fluid into the heat exchanger and is secured to the heat exchanger by the securing structure, wherein the fluid driving unit and the heat exchanger are separately installed and communicated with each other, the fluid driving unit comprises a casing, a space is enclosed by the casing of the fluid driving unit, the cavity of the heat exchanger and the space of the fluid driving unit are separate and independent from each other, the fluid driving unit further comprises an impeller unit and a stator unit, the impeller unit provides power to transmit the working fluid into the heat exchanger, the stator unit is disposed between the impeller unit and the heat exchanger for driving the impeller unit, and a luminous element is disposed on the stator unit and illuminates in accordance with a preset procedure.

2. The heat dissipating module according to claim 1, wherein the heat exchanger comprises:
   a substrate having the heat exchanging zone; and
   a plurality of fins being disposed on the substrate;
   wherein the first casing covers the substrate and the fins, the first casing has a fluid access, and the cavity is communicated with the fluid driving unit via the fluid access.

3. The heat dissipating module according to claim 1, further comprising a fluid level detector or a flow meter for detecting an amount of the working fluid or a flow rate of the working fluid, wherein the luminous element makes a warning or a power consumption of the heat element is reduced when the amount of the working fluid is not enough or the flow rate of the working fluid is abnormal.

4. The heat dissipating module according to claim 1, wherein the securing structure comprises at least one fixed column and at least one limiting wall, and the fixed column is disposed between the fluid driving unit and the heat exchanger for reserving a gap between the fluid driving unit and the heat exchanger.

5. A heat dissipating system, which is adapted to be used with a heat element, comprising:
   a plurality of communicating pipelines for transmitting a working fluid;
   a first heat exchanger;
   a second heat exchanger, which is communicated with the first heat exchanger via a selected one of the communicating pipelines, and has a heat exchanging zone adapted to contact with the heat element, the second heat exchanger further comprising a first casing, a cavity being formed inside the first casing of the second heat exchanger;
   a securing structure; and
   a fluid driving unit, which is secured to the second heat exchanger by the securing structure, wherein the fluid driving unit and the second heat exchanger are separately installed and communicated with each other, and the fluid driving unit is communicated with the first heat exchanger via another selected one of the communicating pipelines, the fluid driving unit comprises a casing, a space is enclosed by the casing of the fluid driving unit, the cavity of the second heat exchanger and the space of the fluid driving unit are separate and independent from each other, the fluid driving unit further comprises an impeller unit and a stator unit, the impeller unit provides power to transmit the working fluid into the second heat exchanger, the stator unit is disposed between the impeller unit and the second heat exchanger for driving the impeller unit, and a luminous element is disposed on the stator unit and illuminates in accordance with a preset procedure.

6. The heat dissipating system according to claim 5, wherein the second heat exchanger comprises:
   a substrate having the heat exchanging zone; and
   a plurality of fins being disposed on the substrate;
   wherein the first casing covers the substrate and the fins, the first casing has a fluid access, and the cavity is communicated with the fluid driving unit via the fluid access.

7. The heat dissipating system according to claim 5, further comprising a fluid level detector or a flow meter for detecting an amount of the working fluid or a flow rate of the working fluid, wherein the luminous element makes a warning or a power consumption of the heat element is reduced when the amount of the working fluid is not enough or the flow rate of the working fluid is abnormal.

8. The heat dissipating system according to claim 5, wherein the securing structure comprises at least one fixed column and at least one limiting wall, and the fixed column is disposed between the fluid driving unit and the second heat exchanger for reserving a gap between the fluid driving unit and the second heat exchanger.

9. A circuit module, comprising:
   a heat element;
   a first heat exchanger;
   a second heat exchanger, which is communicated with the first heat exchanger via a communicating pipeline, and has a heat exchanging zone for contacting with the heat element, the second heat exchanger further comprising a casing, a cavity being formed inside the casing of the second heat exchanger;
   a securing structure; and
   a fluid driving unit, which is secured to the second heat exchanger by the securing structure, wherein the fluid driving unit and the second heat exchanger are separately installed and communicated with each other, and the fluid driving unit is communicated with the first heat exchanger via another communicating pipeline, the fluid driving unit comprises a casing, a space is enclosed by the casing of the fluid driving unit, the cavity of the heat exchanger and the space of the fluid driving unit are separate and independent from each other, the fluid driving unit further comprises an impeller unit and a stator unit, the impeller unit provides power to transmit the working fluid into the second heat exchanger, the stator unit is disposed between the impeller unit and the second heat exchanger for driving the impeller unit, and a luminous element is disposed on the stator unit and illuminates in accordance with a preset procedure.

10. The circuit module according to claim 9, wherein the securing structure comprises at least one fixed column and at least one limiting wall, and the fixed column is disposed between the fluid driving unit and the second heat exchanger for reserving a gap between the fluid driving unit and the second heat exchanger.

* * * * *